United States Patent [19]
Childs et al.

[11] Patent Number: 5,649,164
[45] Date of Patent: Jul. 15, 1997

[54] SETS AND HOLDS IN VIRTUAL TIME LOGIC SIMULATION FOR PARALLEL PROCESSORS

[75] Inventors: Philip Lee Childs, Raleigh, N.C.; Joseph Francis Skovira, Binghamton, N.Y.

[73] Assignee: International Business Machines Corporation, Armonk, N.Y.

[21] Appl. No.: 367,390

[22] Filed: Dec. 30, 1994

[51] Int. Cl.$^6$ .................................................. G06F 9/455
[52] U.S. Cl. ............................. 395/500; 364/578
[58] Field of Search ........................ 395/500, 800; 364/578, 488, 489

[56] References Cited

U.S. PATENT DOCUMENTS

| | | | |
|---|---|---|---|
| 4,306,286 | 12/1981 | Cocke et al. | 364/200 |
| 4,656,580 | 4/1987 | Hitchcok, Sr. et al. | 364/200 |
| 4,862,347 | 8/1989 | Rudy | 364/200 |
| 4,873,656 | 10/1989 | Catlin | 364/578 |
| 4,914,612 | 4/1990 | Beece et al. | 364/578 |
| 4,929,940 | 5/1990 | Franaszek et al. | 340/825 |
| 5,018,089 | 5/1991 | Kanazawa | 364/578 |
| 5,053,980 | 10/1991 | Kanazawa | 364/578 |
| 5,068,812 | 11/1991 | Schaefer et al. | 364/578 |
| 5,111,413 | 5/1992 | Lazansky et al. | 364/578 |
| 5,126,966 | 6/1992 | Hafeman et al. | 364/500 |
| 5,220,512 | 6/1993 | Watkins et al. | 364/489 |
| 5,250,943 | 10/1993 | Childs et al. | 340/825.8 |
| 5,442,772 | 8/1995 | Childs et al. | 395/500 |
| 5,467,462 | 11/1995 | Fujii | 364/578 |

FOREIGN PATENT DOCUMENTS

| 91302627 | 3/1991 | European Pat. Off. | G06F 15/60 |
|---|---|---|---|
| 91302635 | 3/1991 | European Pat. Off. | G06F 15/60 |

OTHER PUBLICATIONS

"Parallel Event–Driven Simulation", IBM Technical Disclosure Bulletin, vol. 33, No. 3A, Aug. 1990, pp. 336–339.

D.R. Jefferson, "Virtual Time", ACM Transactions on Programming Languages and systems, vol. 7, No. 3, (Jul. 1985), pp. 404–425.

Hong K. Kim and Soon M. Chung, "Parallel Logic Simulation Using Time Warp on Shared–Memory Multiprocessors", Parallel Processing, 1994 Symposium, pp. 942–948.

*Primary Examiner*—Kevin J. Teska
*Assistant Examiner*—N. L. Dehlitsch-Moats
*Attorney, Agent, or Firm*—Baker, Maxham, Jester & Meador

[57] ABSTRACT

In an event-driven, virtual time logic simulation system, user-initiated requests for setting and holding simulated logic circuit elements are accommodated during forward simulation, rollback, and advance of system global virtual time.

8 Claims, 9 Drawing Sheets

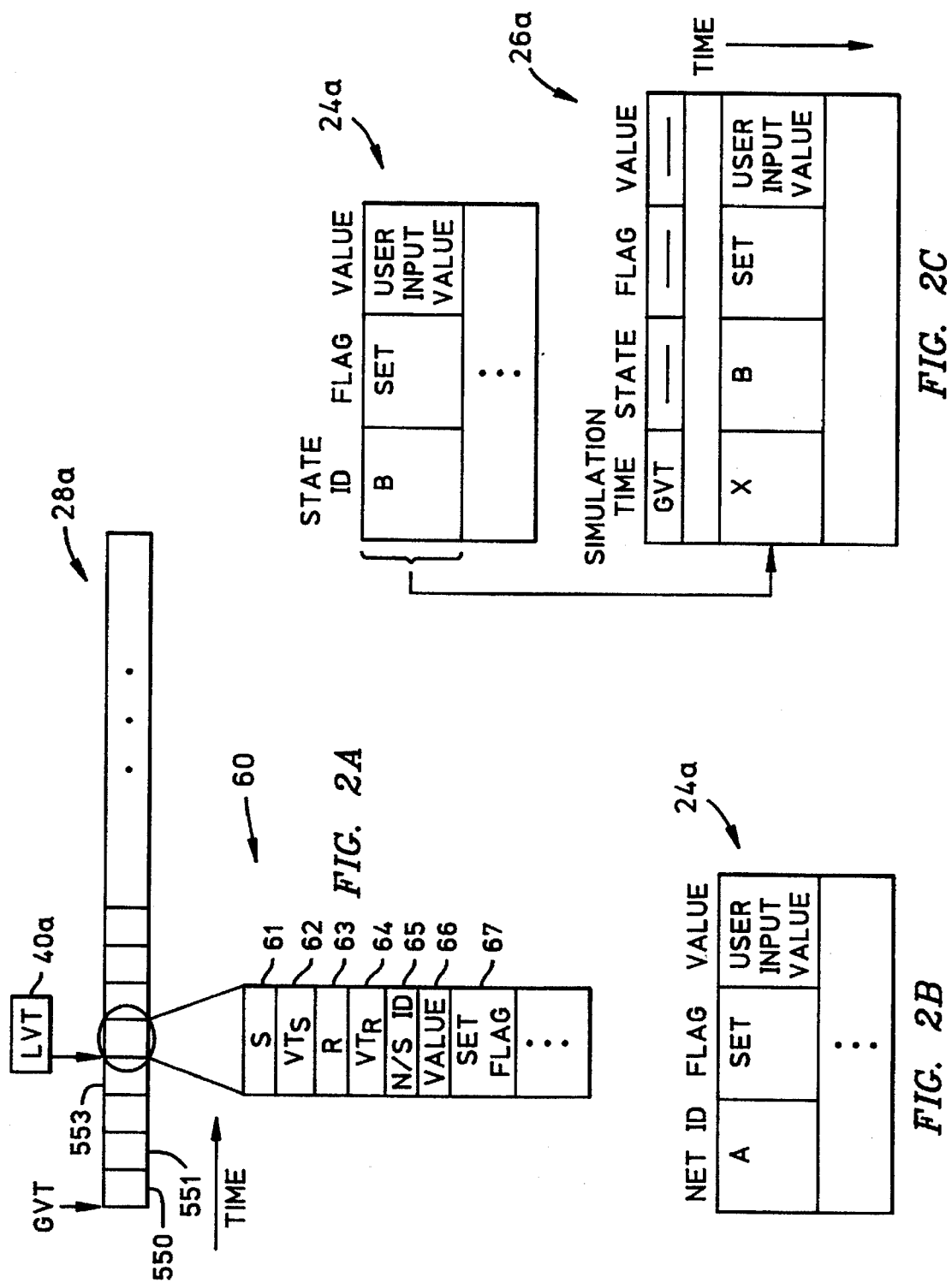

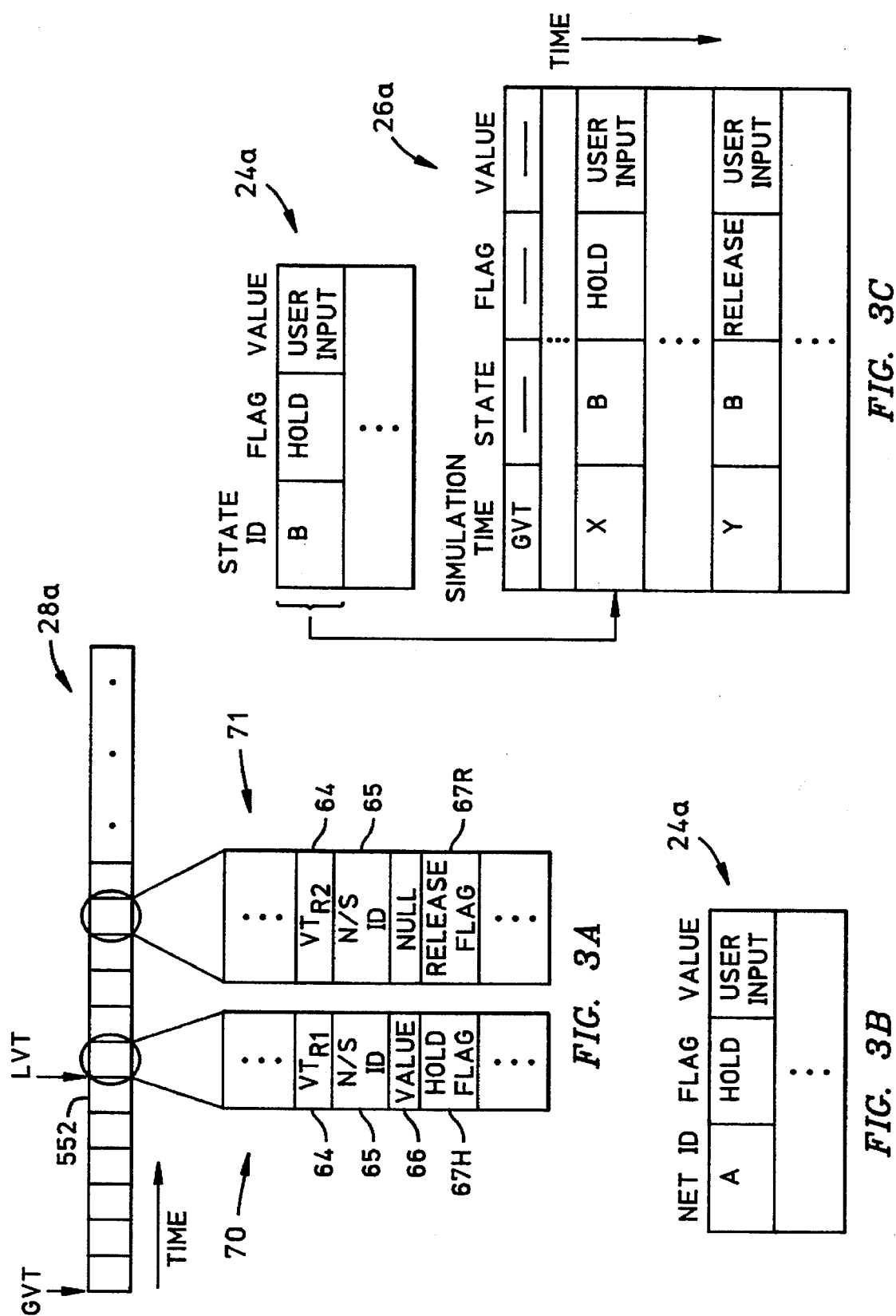

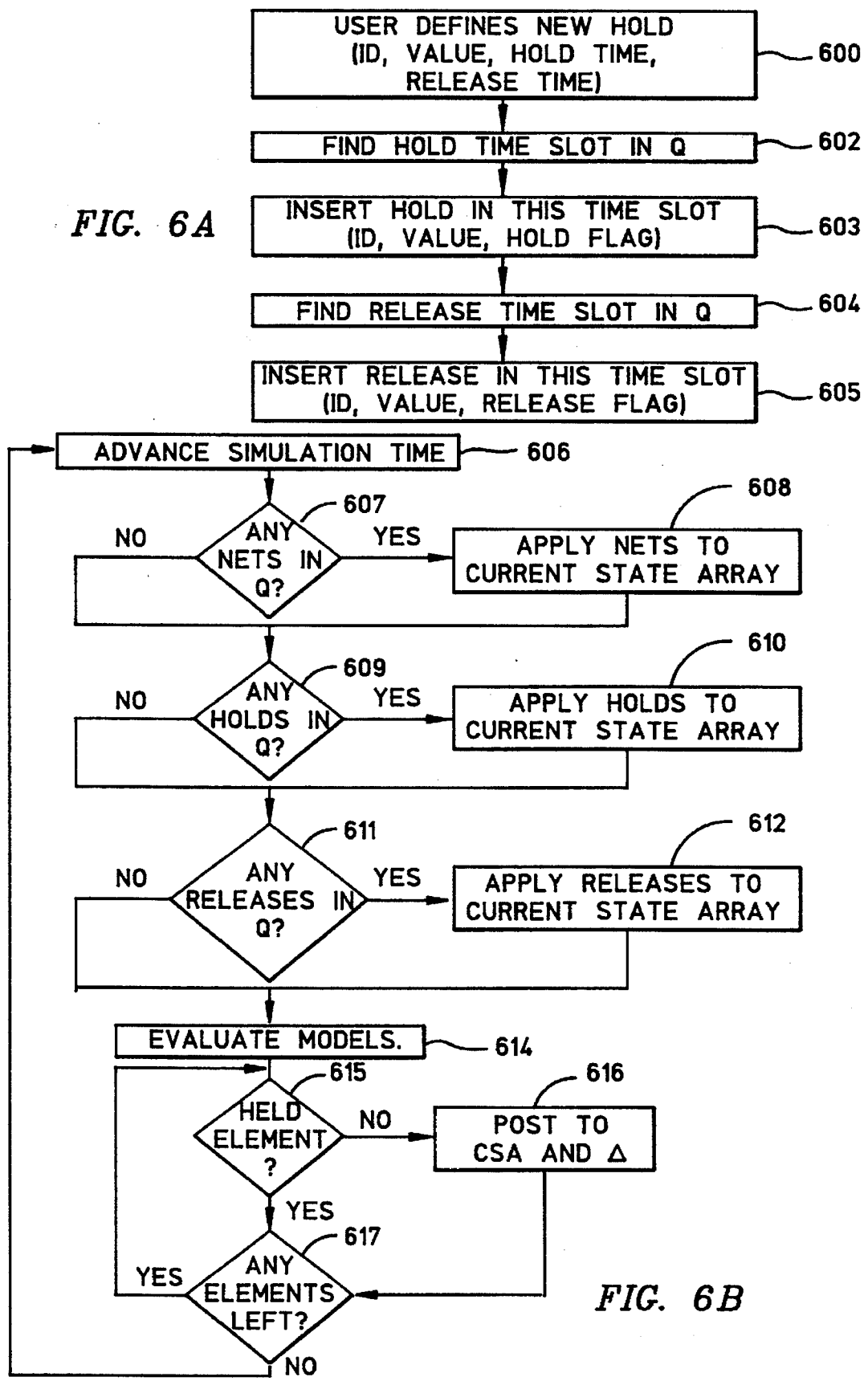

SETS AND HOLDS IN VIRTUAL TIME LOGIC SIMULATION FOR PARALLEL PROCESSORS

CROSS-REFERENCE TO RELATED APPLICATIONS

This paper is related to U.S. patent application Ser. No. 07/993,142, filed Dec. 12, 1992, U.S. Pat. No. 5,442,712 issue Aug. 15, 1995 for "COMMON BREAKPOINT IN VIRTUAL TIME LOGIC SIMULATION FOR PARALLEL PROCESSORS", commonly assigned herewith and incorporated herein by reference.

BACKGROUND OF THE INVENTION

The invention relates generally to electronic logic simulation, and deals more particularly with providing user-initiated set and hold inputs to logic simulation performed on parallel processors for different parts of one circuit.

Previously known logic simulators assist in the design, development and debugging of complex circuitry. For example, the logic simulator may determine if a proposed circuit design performs the requisite function and meets other specifications, before the circuitry is built. The simulator can simulate digital logic and even analog circuitry. Each logic simulator comprises one or more computer programs and data structures to simulate the circuitry. For each logic component, such as an AND gate, the logic simulator program includes a subroutine which performs a logical AND operation and maintains a data structure which stores the inputs and resultant outputs. The computer program can also supply some or all of the digital input signals to the simulated circuit, to initiate operation of the simulated circuit. The digital input signals simulate electronic signals that would be supplied by other circuitry or programming associated with the simulated circuit.

There are different types of logic simulators. Cycle simulators evaluate all gates at each simulation time, and record the respective outputs and states. Because all gates are evaluated at each simulation time, cycle simulators are easy to design, but slow to execute and require much memory.

Event simulators evaluate only those gates whose input(s) have changed at evaluation time. This technique requires sophisticated routines to determine which gates have changed inputs at evaluation time, but requires fewer evaluations at each simulation time compared to cycle simulators. In order to improve the speed of event simulators, different parts of one complex circuit can be simulated on multiple processors or nodes. One part of the circuit simulated on one node can interact with, i.e. provide input signals for and receive output signals from, another part of the same circuit simulated on another node by sending output messages and receiving input messages, respectively.

There are known techniques for coordinating execution of different portions of one simulated logic circuit whose portions are distributed on multiple nodes.

In a "synchronous" technique, all portions of the logic simulation are controlled by a common clock and performed synchronously with all other portions. While this technique provides accurate simulation, no portion of the logic simulation can advance its operation faster than the common clock and many portions have no activity during many of the clock cycles. In a "conservative" technique, each node uses its own simulation clock and proceeds at its own pace (advancing its own clock) until the node requires an input from another (neighbor) node. Then, the node waits for the input. In this technique, each node may spend much time waiting for inputs from other nodes. In a "virtual time" technique, each node uses its own simulation clock and proceeds at its own pace. However, unlike the conservative technique, if one node requires an input from another node and this other node has not yet reached the point of providing the input, then the one node predicts the input and continues on. Later, this other node will provide the input, and if the prediction was wrong, then the one node and any other nodes which received inputs from the one node must be rolled-back and re-executed to reflect the correct input. In most virtual time logic simulators, the predictions are a repetition of the previous input and this is usually correct because in a typical circuit, most inputs do not change often. Thus, the virtual time technique may substantially increase the overall speed of operation of the logic simulation.

In the previously known virtual time technique, when a node detects exhaustion of its resources, it will request a global virtual time calculation. A message is sent to all other nodes and all nodes respond to the requestor with their respective simulation times. After receiving the responses from all the nodes, the requestor determines the minimum of the simulation times. This minimum represents a global virtual time (GVT) for the entire system. All gate outputs and states at or before the GVT are valid because none of the nodes will provide an input for another node at an earlier time and therefore, none of the nodes will be rolled-back before the GVT. It was also known in the virtual time technique for each of the nodes to report to the host a minimum virtual time instead of the actual simulation time. The minimum virtual time is the minimum of the actual simulation time and the virtual time of any messages that the node has sent to another node and not yet received an acknowledgment. This ensures that the resultant GVT cannot be undermined by any messages in transit. After all nodes complete their portion of the logic simulation, a host user may request various nets and states of the simulated logic.

An exemplary virtual time system comprising a plurality of processor nodes with means for calculating GVT at any of the processor nodes is described in U.S. Pat. No. 5,250,943, commonly assigned herewith and incorporated herein by reference.

During logic simulation in a virtual time logic simulator, a user may desire to set (or hold) elements of the simulated logic at specific values for a period of simulation time. However, the known virtual time logic simulation systems do not support user modification of the inputs to, or the states of, simulated logic circuit elements during simulation. A general object of the present invention is, therefore, to enable a user to introduce sets or holds for identified elements of a simulated logic circuit during simulation.

SUMMARY OF THE INVENTION

A logic simulator is distributed over a plurality of processing nodes for simulating a circuit. A plurality of logic simulation programs execute on respective ones of the nodes, and simulate respective parts of the circuit. Each of the logic simulation programs executes at its own pace, and either receives inputs or supplies outputs to another of the processing nodes. During execution, any logic simulation program may receive an input from another of the processing nodes or from a user. In this regard, a user input may set or hold the condition of a simulated logic circuit element for a period of simulation time. An input including a user-initiated "set" alters the value of a logic circuit element at an instantaneous simulation time. If the simulation changes the condition of the logic circuit element at a simulation time after the set has been applied, the set vanishes. A user-initiated "hold" alters the condition of a logic circuit element over a given span of simulation time, regardless of how the simulation affects the logic circuit element during this time. Application of a hold by a user at a given simulation time, therefore, implies specification of the time span.

BRIEF DESCRIPTION OF THE DRAWING

FIGS. 2(A, B, and C) show data structures in a simulation system executing on the computer network of FIG. 1 that are used for setting nets and states in a simulated logic circuit according to the invention.

FIGS. 3(A, B, and C) show data structures in a simulation system executing on the computer network of FIG. 1 that are used for holding nets and states of a simulated logic circuit according to the invention.

DETAILED DESCRIPTION OF THE PREFERRED EMBODIMENTS

Figure 1:
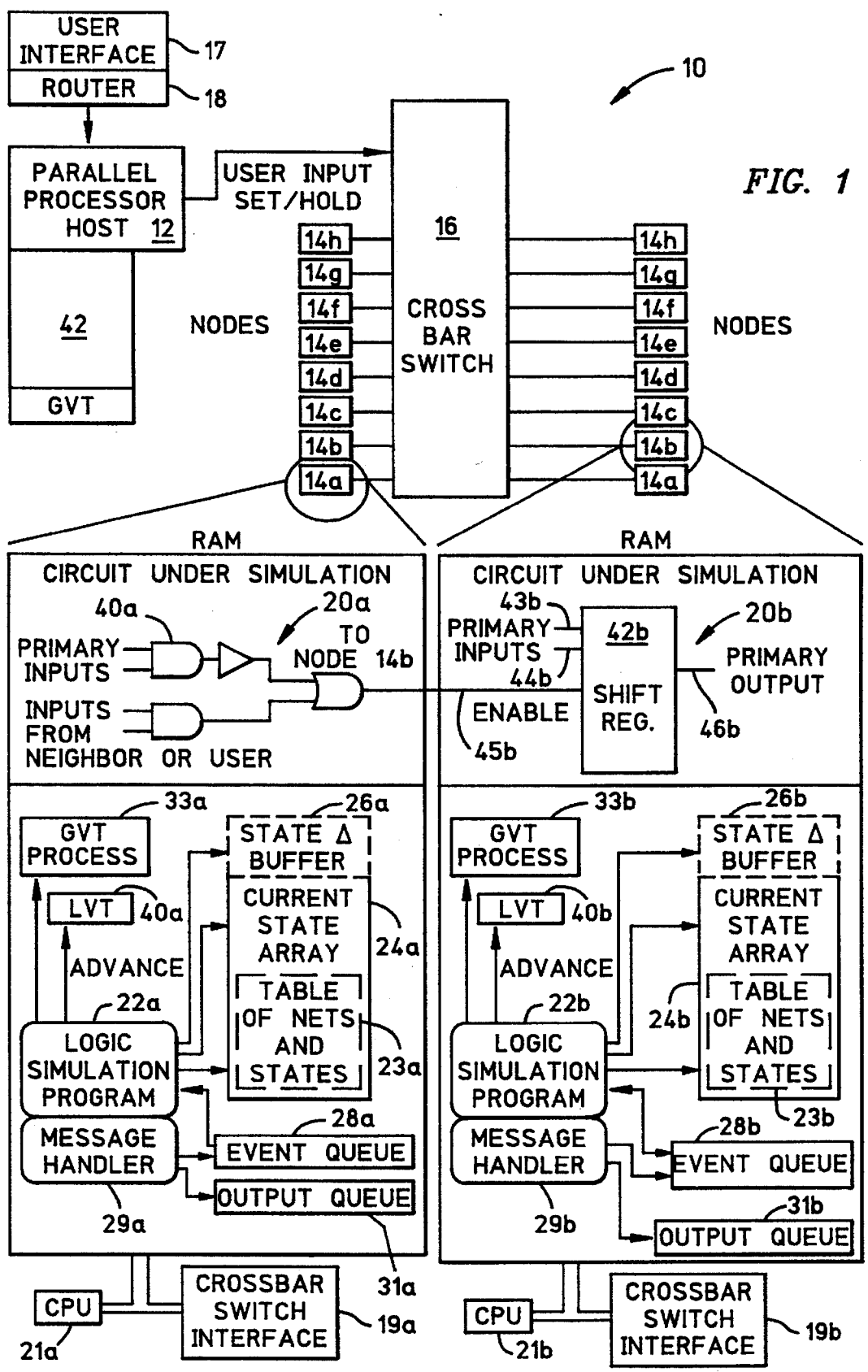
FIG. 1 is a block diagram of a computer network comprising a host computer and parallel processors. The network simulates a circuit and processes nets and states of the simulated circuit according to the present invention.

Referring now to the figures in detail wherein like reference numerals indicate like elements throughout the several views, FIG. 1 illustrates a distributed logic simulator generally designated 10 according to the present invention. Logic simulator 10 comprises a host computer 12 with a known communication facility (not shown), a multiplicity of processing nodes 14a–h each with a respective known communication facility (not shown), and a known cross bar switch 16 which interconnects the host computer to the parallel processors and the parallel processors to each other. By way of example, the host computer and each of the parallel processors is provided by a RISC/6000 (R) work station, and the crossbar switch 16 and interface 19 may comprise the multi-sender/switching network and related interfaces described in the incorporated U.S. Pat. No. 5,250,943. Alternatively, the crossbar switch 16 and interface 19 may be as described in U.S. Pat. No. 4,929,940, which is hereby incorporated by reference as part of the present disclosure.

A standard user interface 17 which may comprise, for example, a keyboard, mouse, and display, is connected to a router 18 that executes in the host 12. When user inputs are provided through the user interface 17, the inputs are appropriately processed by the interface, which, thereby to place them in a message format, and then by the router 18 which determines the intended destinations of the messages and places them on the crossbar switch 16 and interface 19.

Each of the nodes simulates a respective portion 20a–h of a logic circuit (although for simplicity only two of the parallel processing nodes 14a,b and two of the corresponding logic circuits 20a,b are shown in detail in FIG. 1, and only simple logic is shown). The simulation of logic portion 20a is provided by a logic simulation program 22a which executes on a CPU 21a and maintains a corresponding current state array (CSA) 24a comprising, for example, table of nets and states 23a. The table 23a records the conditions of the nets and states (inputs/outputs and states) of each simulated logic circuit element at each time that the simulated logic advances in its simulation, i.e. each time that the simulated logic receives a new input from a user or another processing node. The logic simulation program 22a also maintains a state Δ buffer 26a wherein changes to the current state array 24a are saved to support rollback. In this regard, the state Δ buffer 26a contains a trace reporting the sequence of nets and states of the logic simulation program 22a since GVT. An event queue 28a receives messages sent to the processing node 14a, which are received by a message handler 29a. The message handler 29a comprises a routine that performs virtual time message processing. The inventors contemplate that the message handler may preempt the logic simulation program 22a in a single tasking environment or comprise a different thread in a multi-tasking environment.

The message handler 29a, upon receiving a message, places the message on the event queue 28a. The event queue 28a stores messages in the order of the virtual time at which they are to be processed. In the prior art, this virtual time is denoted as "receive time". The message handler also maintains an output queue 31a on behalf of the logic simulation program 22a. The output queue 31a stores, in local virtual time sending order, inverse or "negative" copies of messages sent by the processing node 14a. Negative messages are retained in case, during rollback, events resulting from messages sent by the processing node 14a must be undone. The logic simulation program 22a includes a global virtual time (GVT) process 33a (which is shown as a separate element in FIG. 1). The GVT process 33a enables the processing node 14a to initiate a GVT calculation, during which a GVT value is calculated. Typically, the GVT process 33a manages memory and buffer overheads, performing "garbage collection" and provides an earliest time reference for rollback. The GVT process 33a responds to initiation of GVT calculation of another processing node by sending local time minima which the initiating node uses to calculate GVT.

When the program 22a receives inputs for the simulated logic 20a, the program 22a processes the inputs to yield the same result that actual logic would yield, using the current state array 24a to store the inputs/outputs and state of each logic component of the simulated logic 20a. For example, the nets for AND gate 40a would indicate the logic levels for the two inputs and the logic level for the single output at each advancement time. The nets 43b–46b for shift register 42b would indicate the logic level for each of the inputs and output, and the state of shift register indicates the latched level when the shift register was last clocked.

In FIG. 1, "primary inputs" are inputs to the circuit being simulated and are generated externally of the circuit when simulation is initiated. "Inputs from neighbor or user" refers to inputs provided during simulation by outputs from another node or by inputs from a user through the user interface 17. "Primary outputs" are outputs generated by the simulated circuit and can be observed externally of the simulated circuit, and "outputs to neighbors" refers to outputs supplied to another node as an "input from neighbor". The actual logic simulation performed by each of the logic simulation programs 22 alone can be that described in "Virtual Time" published in *ACM Transactions on Programming Languages* by Jefferson Vol. 7, No. 3, July 1985, pages 404–425, and is not part of the present invention. (The present invention relates to conditioning nets and states of simulated logic on different nodes by user-requested initiation of sets and holds during simulation.) As described in more detail below, each of the logic simulation programs 22 proceeds at its own pace, responding to inputs from neighbors and from a user, and predicting inputs when needed and not yet available from another node. Different types of prediction techniques are known from the prior art as described above. The most common technique for such inputs assumes that the input does not change with time.

Each of the nodes exhibits a "local virtual time" (LVT) which indicates the point in time at which the respective logic simulation has advanced. Each of the logic simulation programs 22 establishes the LVT for the respective node by the progress of its simulation and maintains a record of the current LVT in a control block. It should be noted that if a predicted input for a node was incorrect as evidenced by an actual input subsequently provided by another (neighbor) node, then the logic simulation and LVT for the node must be rolled-back to the point when the input was required and re-executed from this point onward with the actual input. The invention assures that rollback accommodates user-initiated sets and holds in returning to the point where re-execution commences. The LVT is usually different at each node. Also, as described below, the host records global virtual time (GVT) in a control block 42. As previously discussed, GVT is a minimum time at or beyond which all nodes have advanced. As a general rule, once all nodes have advanced to or beyond a certain time, then none of the nodes will need to roll back before this time because all will have the actual inputs available at this time. Thus, the GVT is a time at which the nets and states for all nodes are valid.

The invention presumes that logic simulation in the context of FIG. 1 proceeds on an interactive basis. That is, a user may input set and hold values by way of the user interface 17 and router 18. Further, a user may view the current state of logic simulation, which is the union of the current state arrays of the processing nodes, at the user interface 17.

FIGS. 2(A, B, and C) illustrate in more detail how the event queue, current state array, and state Δ buffer are used for setting nets and states in a simulated logic circuit according to the invention. The event queue 28a queues messages received from other processing nodes in order of receive time. The event queue 28a is divided into increments of virtual time; each increment is a "time slot". The oldest (earliest) message on the event queue 28a is no older than the current value of the GVT. The event queue 28a retains messages older than the current value of LVT (that is, messages with receive times less than LVT), which the processing node 14a has already processed. These messages are retained to support rollback, if necessary. The queue time slot corresponding to the current value of LVT 40a is held by a message 60. Messages which are "younger" than the message 60 are queued forward of the message 60; these messages have receive times that are greater than LVT.

The format of the message 60 includes fields 61–64 that are common to all messages in a virtual time logic simulation system as described by Jefferson. In this regard, the field 61 contains an identification of the sending processing node (S) which sent the message 60. The field 62 includes the local virtual time ($VT_s$) value at the sending node when the message was sent; this is referred to as "send time". Identification of the receiving processing node (R) is contained in field 63. The receive time given the message by the sending processor ($VT_r$) is contained in the field 64. Message field 65 provides identification (ID) of a net (N) or state (S) in the logic circuit being simulated. Field 66 is provided to convey the value to which the logic element identified in message field 65 is to be set.

It is known to use messages having the format of the message 60 for internode conveyance of information which denotes "events". Jefferson defines an event as "a deterministic sequential computation" conducted at a processing node. In the prior art, such messages are used to convey primary inputs to processing nodes and the inputs and outputs between nodes.

The inventors are aware of no provision for conveying user-initiated sets and holds from a user interface during processing in a virtual time logic simulation system. The message structures illustrated in FIGS. 2A and 3A have been devised by the inventors for this purpose. Relatedly, for sets, the invention provides a multistate flag field 67 so that a message having the format of the message 60 may convey user-initiated sets of nets and states to the system of FIG. 1 during logic simulation. To signify a set, the multi-state flag field 67 is conditioned to indicate that the message 60 is a user-initiated set of the net or state identified in field 65. This condition is referred to as the "set" flag.

Sets of either nets or states can be applied by a user during interactive simulation of a logic circuit. Sets of either nets or states are transmitted using the message format illustrated in FIG. 2A from the user interface to a receiving processing node. As with inter-processing node messages, user initiated messages can signify events that occur for some simulation time in the future. At receiving processing nodes, these messages are treated in the same manner as messages received from sending processing nodes. They are saved in the event queue of the receiving processing node where they are ordered with other received messages according to receive time. Manifestly, flagging user-initiated sets with the field 67 ensures that the logic simulation system can distinguish them from simulation system-generated changes to nets or states. Nevertheless, the processing nodes of the logic simulation system treat the events signified by user-initiated sets in precisely the same manner as it treats system-generated changes. Whenever a set is encountered during logic simulation, a record of it is placed in the current state array. The current state array 24a is illustrated in FIGS. 2B and 2C. FIG. 2B represents the array 24a with an entry signifying setting of a value for a net; in FIG. 2C, the entry is for setting the value of a state.

In particular, for sets of nets, the current state array 24a is modified to store the set flag. This is signified in FIG. 2B where the current state array 24a includes an entry for net A which is conditioned to a user-defined input value. The entry for net A is identified as a "set" by provision of a set flag in a flag field.

With respect to the current state array 24a, the set of net A is handled just like a normal event. Relatedly, the set of net A is read off of the event queue 28a when local virtual time 40a advances to the time in the receive field of the message containing the set and stored in the current state array 24a before event evaluation occurs in the current state. When in the current state array 24a, the set of net A triggers evaluations and disappears when GVT advances beyond its time slot, or when extinguished by an antimessage from the user. During a rollback, sets of nets are treated in the same manner as normal net events.

A user-initiated set state is treated somewhat differently by the logic simulation system than normal states. In the prior art, states are not placed in the event queue. In the invention, however, a set state appears in the event queue 28a at some future time. When the time slot of the set state is reached, it is applied to the current state array 24a along with other nets and states before evaluations occur in the current state. To a user, this means that set state changes a state that exists at the beginning of a simulation time. Further, in accord with typical operation of a virtual time logic simulation system, state changes during evaluation at this simulation time slot are put into the current system array 24a after evaluation.

An entry according to the invention for setting state B to a user input value is shown in the current state array 24a in FIG. 2C. In addition to being placed in the current state array 24a, a set state is added to the state Δ buffer 26a. This is shown in FIG. 2C. Assume that at LVT=X, the user sets state B to a designated input value. The entry to this effect is placed in the current state array 24a after LVT changes to X, but before any event takes place. After the event takes place, the current value of the table of sets and nets, including an entry for B set to the user input value, is placed in the state Δ buffer 26a, indexed by the time of the event which is X.

During a rollback, prior to a state set, the current state array 24a is rolled back using the state Δ buffer 26 which, as those skilled in the art will appriciate will correctly apply any set states when the logic simulation program 22a recommences forward processing after rollback. When GVT is calculated, the current state array 24a is rolled forward using the state Δ buffer 26a so that a user-initiated set state will be correctly applied to the "base" state. Relatedly, the base state is the state defining the condition of the logic simulation program 22a at the time indicated by GVT. Those skilled in the art will appreciate that any set state message on the event queue 28a might also be extinguished by an antimessage if the user elects to turn off the set state at precisely the same time it was turned on.

Refer now to FIGS. 3A–3C for an understanding of how user-initiated holds on nets and states are implemented according to the invention. FIG. 3A illustrates the event queue 28a with a pair of messages 70 and 71 having formats that are essentially identical to the format of the message 60 illustrated in FIG. 2A. In FIG. 3A, the message 70 is referred to as a "hold" message and the message 71 as a "release" message. The fields shown in FIG. 3A for the hold and release messages 70 and 71 are identical with the identically-numbered ones described in connection with the message 60. The sole exceptions are field 67H in the hold message 70 and field 67R in the release message 71. These fields have the same location and bit size as the field 67 in message 70, however, the multi-state flag in field 67H of the hold message has been conditioned to indicate that the message is a user-initiated hold. This is referred to as a "hold" flag. In message field 67R, the multi-state flag has been set to a "release" condition (called a "release" flag). In response to a hold/release pair of events, the logic simulation program 22a puts an entry into the current state array 24a indicating that the identified logic element is held at a user input level indicated by the value field 66 of the hold message. The logic simulation program 22a makes an entry into the table of sets and nets of the current state array 24a and sets the hold flag in the flag field of the array entry for the identified logic element.

Holds on nets or states involve more management than sets. Unlike a set, the logic simulation program 22a must maintain a hold until an event occurs identifying the held logic element with the multi-state flag set to the "release" condition. Thus, the hold must be maintained until canceled by a user-initiated release, regardless of how the logic simulation program 22a seeks to alter the logic element.

For holds of nets, the user sends a hold message with a first receive time, followed by a release message for the net having a later receive time than the hold message. These messages are placed, in their receive time slots, on the event queue 28a. When the logic simulation program 22a encounters the activation of the hold for the net, the net information is handled identically to a normal event except that the hold flag is set for the identified net in the current state array 24a. In FIG. 3B, a hold for a net A at a user input value is represented by an entry into the current state array 24a. Before changing the value of the net, the logic simulation program 22a checks the condition of the hold flag. If the hold flag is set, the simulator leaves the value of the net alone. When the release event is encountered, the hold flag in the current state array 24a is reset, leaving the logic simulation program 22a free to alter the net. Since the hold message setting the hold flag is preserved in the event queue, a rollback into the time marked by the hold message will correctly preserve both the desired hold value in the form of the hold message and the indication in the release message to preserve the hold until a future time. Manifestly, saving the hold and release messages in the event queue 28a allows the logic simulation program 22a to freely roll back over either one or both of these events.

States are held by a hold message/release message pair sequenced in the event queue 28a as described above in connection with FIG. 3A. Manifestly, this is a departure from standard virtual time logic simulation, since changes to states are not placed in the event queue 28a in prior art virtual time logic simulation systems. As FIG. 3C shows, hold and release messages for a state perform the same function as for nets: to set or reset the hold flag of the identified logic element in the current state array 24a. In addition, the hold message conveys the value at which the logic element is to be held. For rollback, the hold and release events for a state are preserved in the state Δ buffer 26a. During rollback, the state Δ buffer 26a is used to unroll the current state array 24a to a rollback value of LVT which occurred in the past. In order to preserve the hold function intact, the hold and release events for a state are preserved in the state Δ buffer as well. During rollback, the copies of the current state array in the state Δ buffer 26a are traversed in reverse time sequence from LVT at the time rollback commenced until the LVT immediately preceding the rollback time. During traversal any state which has been held will be signified by the hold flag, until the time when the flag was set is traversed. Thus, if rollback ceases at a time younger than the receive time of the hold message, but older than the receive time of the release message, the hold will be maintained in the current state array 24a when rollback completes and processing restarts.

Figure 4A:
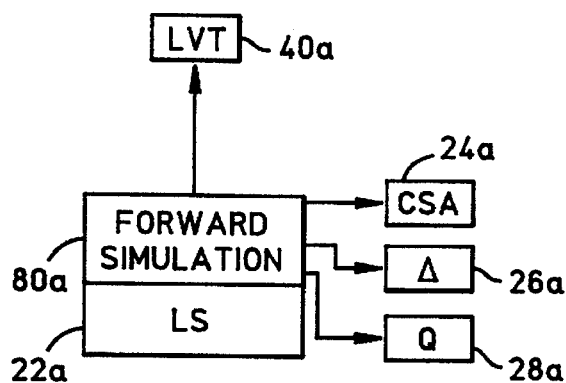
FIGS. 4(A, B, and C) are block diagrams illustrating architectures for operating forward simulation logic, rollback logic and GVT advance logic according to the invention.
Figure 4B:
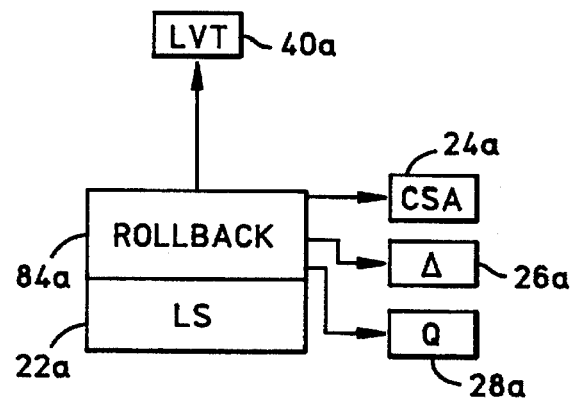
Figure 4C:
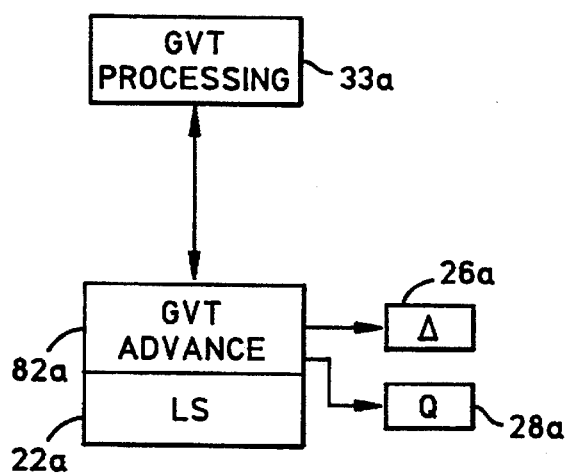

FIGS. 4A–4C illustrate, in further detail, logic used to implement the invention. The descriptions of these figures refer to architecture of the processing node 14a, with the understanding that this architecture is identical to all of the processing nodes 14b–14h.

FIG. 4A illustrates the logic simulation program (LS) 22a as including a distinct routine or program object 80a. Hereinafter, this is referred to as the "forward simulation component" of the logic simulation program 22a. During operation of the forward simulation component 80a, the event queue (Q) 28a, the current state array (CSA) 24a, the state Δ buffer (Δ) 26a, and the local virtual time data block (LVT) 40a are used.

In FIG. 4B, a rollback component 84a of the logic simulation program 22a is illustrated. During operation of the rollback component 84a, the event queue 28a, the state Δ buffer (Δ) 26a, the current state array 24a, and the LVT 40a are accessed.

In FIG. 4C, the logic simulation program 22a includes a GVT advance 82a component whose operations require access to the event queue 28a and to the GVT processing component 33a.

In the preferred embodiment, the forward simulation, GVT, and rollback components, 80a, 82a, and 84a are distinct portions of the logic simulation program 22a. In this regard, they comprise software routines that are compiled and executed with the logic simulation program 22a. This is not intended to limit these components to be practiced as software, since they also may be implemented in firmware or hardware.

Figure 5A:
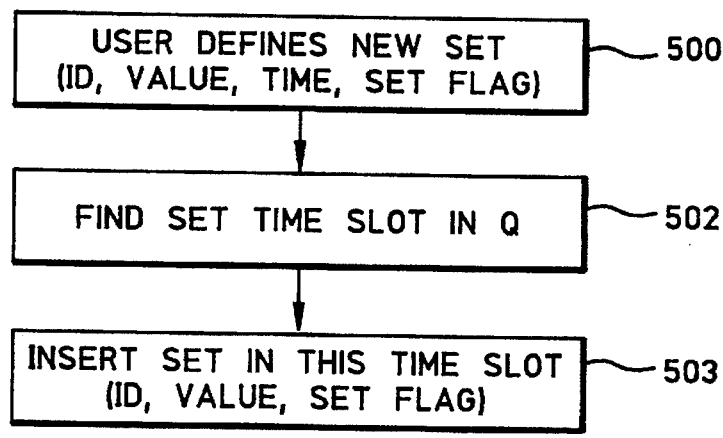
FIGS. 5(A, B, C, and D) form flow charts which illustrate set processing according to the invention.

Turning now to FIG. 5A, process steps executed at the user interface 17 for initiating processing of a set are illustrated. In step 500, a user defines a new set at the user interface 17 by inputting the ID of a net or state, a value to which the identified logic element is to be set, and a receive time at which the element is to be set. These parameters are processed into the message format illustrated in FIG. 2A, and sent to a processing node identified in the message. For the following explanation, it is assumed that processing node 14a is identified in the message.

At processing node 14a, step 502 is executed in response to receipt of the message input by the user in step 500. In this regard, a time slot in the event queue 28a corresponding to the receive time in the message is identified and, in step 503, the message is placed in the time slot.

Figure 5B:
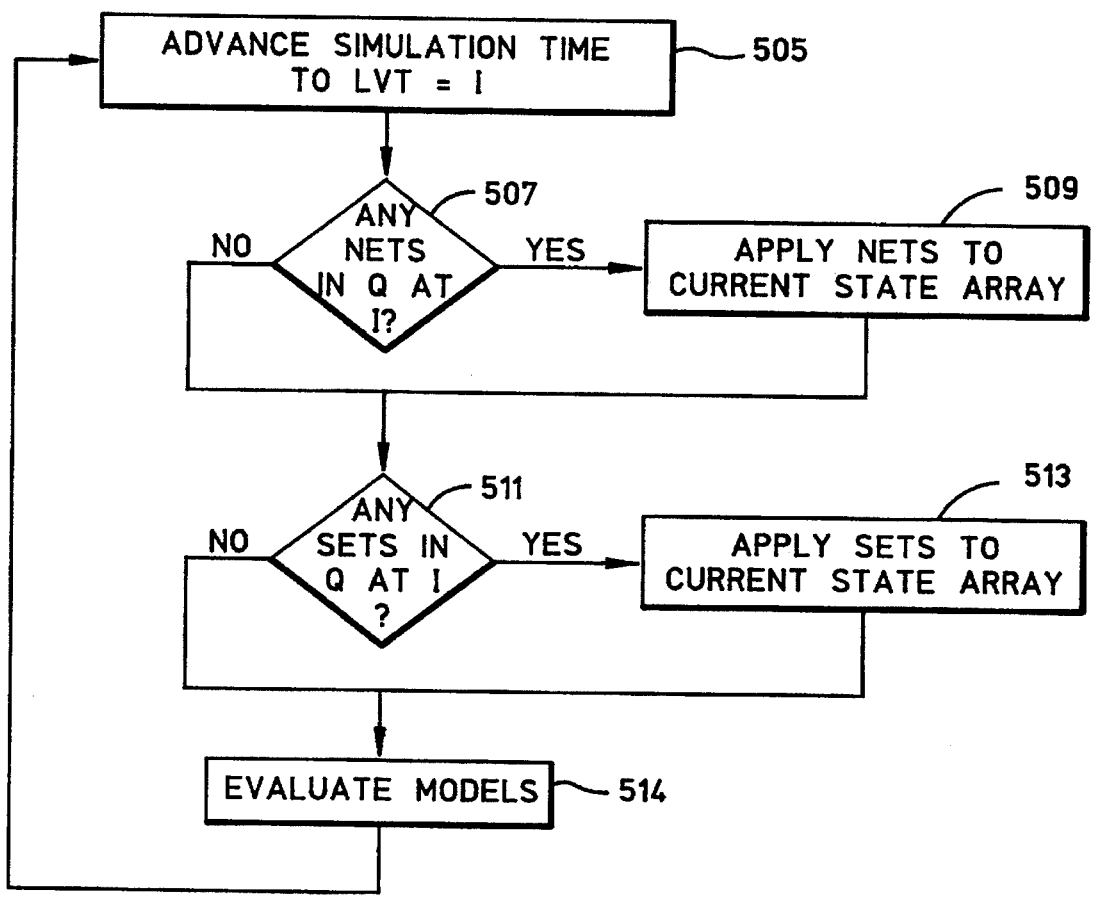

FIG. 5B illustrates the operations of the forward simulation component 80a in response to a message placed in the event queue 28a according to the steps of FIG. 5A. In step 505, simulation time at the processing node 14a is advanced by incrementing LVT. In this case, the current simulation time is I. In step 507 at the event queue slot corresponding to I, the event queue 28a is inspected to determine whether any nets in the form of inputs from other processing nodes are present. If so, the nets are applied to the table of nets and states in the current state array 24a in step 509. Next, in step 511, the event queue 28a is inspected at slot I to determine whether any sets are present. If so, they are applied to the table of nets and states in the current state array 24a in the form indicated in FIGS. 2B and 2C in step 513. Processing then proceeds to step 514 where the portion of the logic circuit modeled by the logic simulation program 22a is evaluated in response to the table of nets and states in the current state array 24a. Once evaluation is completed, the forward simulation component 80a loops back to step 505.

Not shown in FIG. 5B is processing of the state Δ buffer 26a. This is because the frequency with which changes to the current state array are copied to the buffer is a design choice. Nevertheless, the current state array changes must be copied at least twice, once preceding evaluation to capture sets, and once after to capture the result of evaluation.

The cited article by Jefferson describes a lookahead rollback function for synchronizing the distributed parallel components of a virtual time system. In this regard, discovery of a conflict at a processing node results in rollback of processing at the node to a point of time preceding the conflict, revision of the processing path, and then forward processing along the revised path. For example, Jefferson pointed out that a processing node might receive a message with a receive time less than LVT at the node. In this case, a conflict is detected by comparing the receive time of the incoming message with LVT at the processing node. Upon detection of the conflict, processing is quiesced at the processing node and rollback commences. In rollback, the message is inserted in the event queue at its receive time location. The trace of previous states is then followed in reverse time sequence back to the entry for the LVT immediately preceding the receive time of the incoming message. The state for that entry is restored in the current state array and LVT is reset to the corresponding time. The trace of previous states is cleared of all entries following the reset LVT. Antimessages held in the output queue with send times equal to or greater than the restored LVT are sent to annihilate their positive counterparts. Processing then resumes from the restored LVT.

Figure 5C:
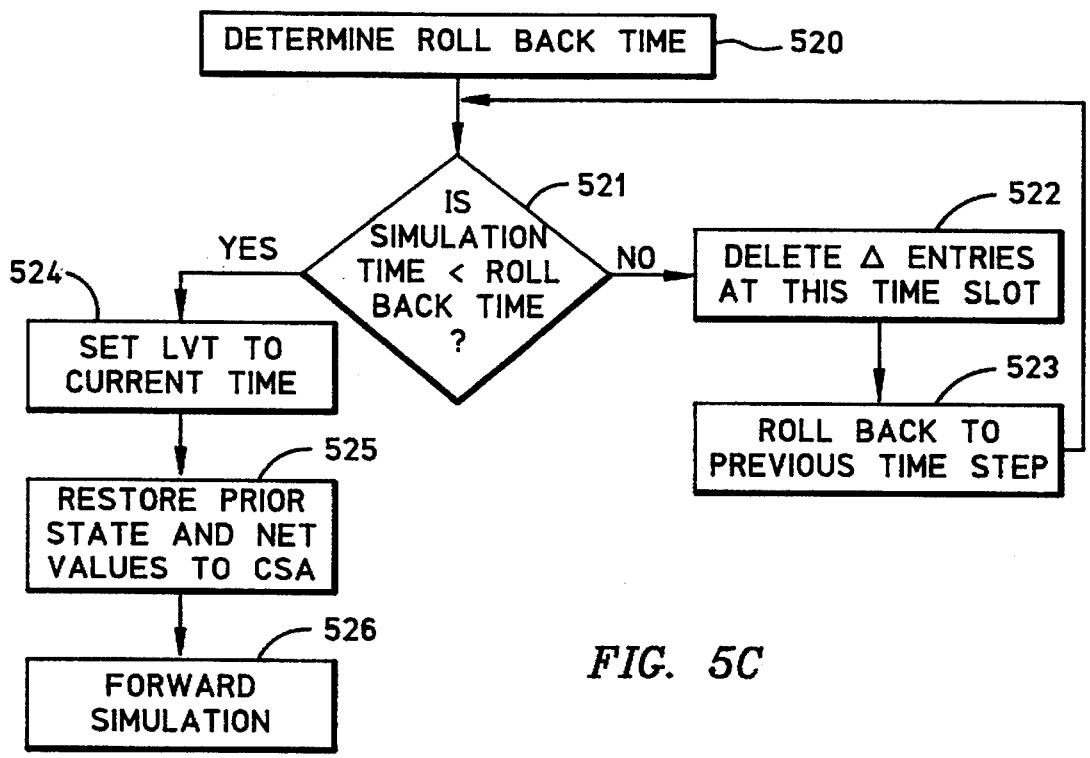

Rollback in response to sets according to the invention is illustrated in FIG. 5C. In this regard, in step 520, a determination is made that rollback is necessary to resolve some conflict detected by the logic simulation program 22a. Also determined in step 520 is the time to which LVT must be reset. This time is termed "rollback time". Next, the loop 521, 522, and 523, is traversed by inspecting the entries in the state Δ buffer in reverse time sequence, beginning with the current value of LVT and continuing until a time immediately preceding the rollback time. In this loop, each entry younger than the rollback time is deleted from the buffer. Eventually, when the simulation time is at the time state immediately preceding the rollback time, the positive exit is taken from decision 521, LVT is reset to the rollback time in step 524, and in step 525, the current state array 24a is set to the simulation time immediately preceding the rollback time. In the invention, if the rollback cancels an event which resets a previous set, the rollback will correctly restore the set. Forward simulation then resumes in step 526.

Figure 5D:
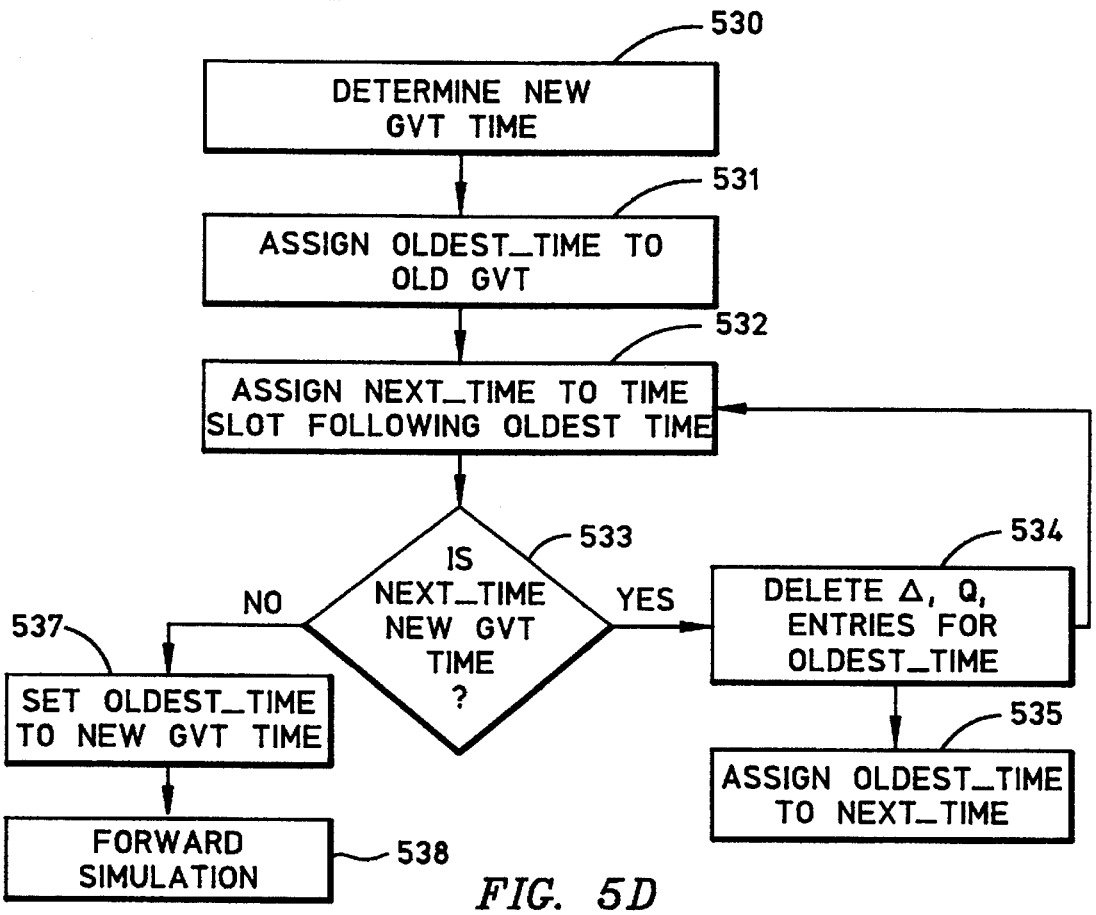

In FIG. 5D, it is assumed that a call has been made to the GVT process 33a to calculate a new GVT. This call occurs in step 530 which returns a new GVT time when completed. In step 531, a data object denoted as "oldest_time" is assigned the value which GVT had when the GVT process was initiated. In step 532, a data object denoted as "next_time" is used to control iteration through a sequence comprising steps 533, 534, and 535.

In the loop 533, 534, 535, 532, the values oldest_time and next_time, which differ by one unit of virtual time ("a time slot") are advanced in lock step from the point where oldest_time=OLD GVT to the point where next_time= NEW GVT TIME. At each increment, the entries in the state Δ buffer 26a and the event queue 28a in the time slots corresponding to oldest_time are deleted. When next_time=NEW GVT TIME, the loop is exited, oldest_time is set equal to NEW GVT TIME in step 537 and forward simulation is commenced in step 538. The GVT processing logic illustrated in FIG. 5D moves the GVT pointer in the event queue 28a to the new GVT position and discards all state Δ buffer entries and event queue events prior to the new GVT position. In this respect, the GVT advance component 82a performs "garbage collection" with respect to the resources used by the state Δ buffer 26a and the event queue 28a.

Turning now to FIG. 6A, process steps executed at the user interface 17 for initiating processing of a hold are illustrated. In step 600, a user defines a new hold at the user interface by inputting the ID of a net or state, a value at which the identified logic element is to be held, a receive time at which the hold event is to occur, and a receive time at which the release event is to occur. These parameters are processed into hold and release message formats in accordance with FIG. 3A, and sent to a processing node identified in the messages. For the following explanation, it is assumed that processing node 14a is identified in the hold and release messages.

At processing node 14a, steps 602–605 are executed in response to receipt of the hold and release messages input by the user in step 600. In this regard, time slots in the event queue 28a corresponding to the receive time and the hold and release messages are identified in steps 602 and 604 and, in steps 603 and 605, the messages are, respectively, placed in the time slots.

FIG. 6B illustrates the operations of the forward simulation component 80a in response to hold and release messages placed in the event queue 28a according to the steps in FIG. 6A. In step 606, simulation time at the processing node 14a is advanced. In step 607, at the event queue slot corresponding to LVT, the event queue 28a is inspected to determine whether any nets in the form of inputs from other processing nodes are present. If so, then nets are applied to the table of nets and states in the current state array 24a in step 608. Next, in step 609, the event queue 28a is inspected at the current LVT time slot to determine whether any holds are present. If so, they are applied to the table of nets and states in the current state array 24a in the form indicated in FIGS. 3B and 3C in step 610. Processing then proceeds to step 611 where the event queue 28a is inspected at the current LVT time slot to determine whether any releases are present. If so, they are applied to the table of net and states in the current state array 24a in the form indicated in FIG. 3C. Processing then proceeds to step 614 where the portion of the logic circuit model by the logic simulation program 22a is evaluated in response to the table of nets and states in the current state array 24a. If evaluation affects a simulated logic element which is held, the held value is not changed and is not saved in the state A buffer. This is shown in the loop comprising steps 615, 616, and 617, which clearly illustrate that only the values of those elements that are not held are posted to the current state array 24a and to the state Δ buffer. Once evaluation is completed, the forward simulation component 80a moves back to step 606.

Figure 6C:
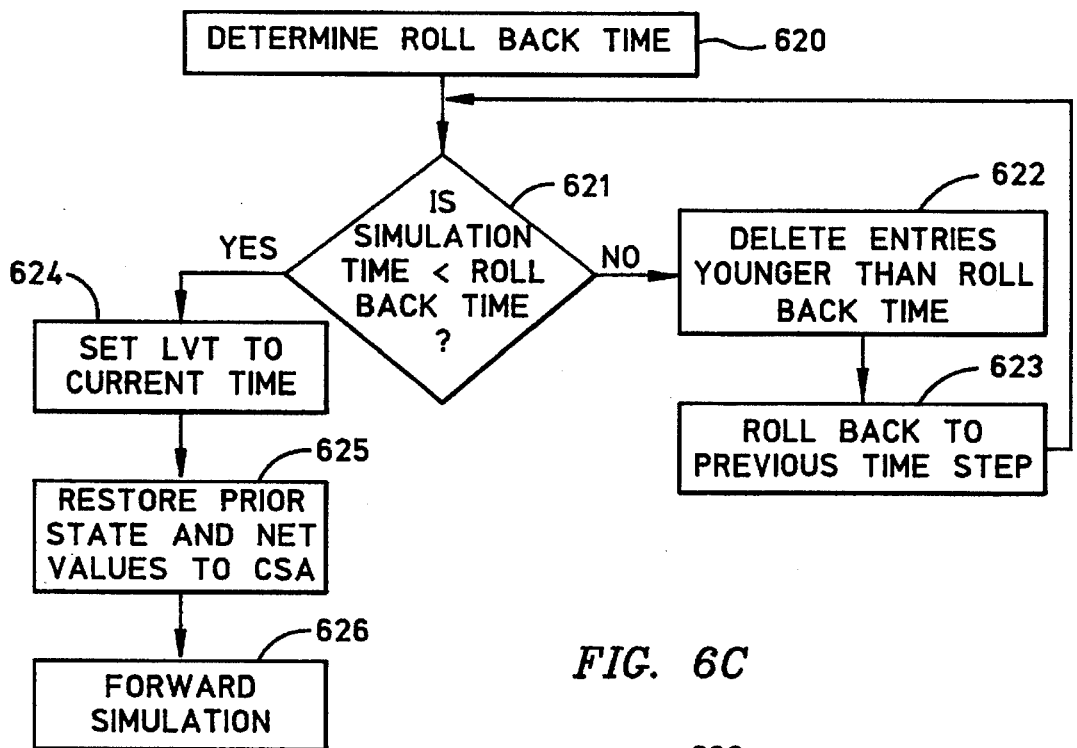
FIGS. 6(A, B, C, and D) form flow charts which illustrate hold processing according to the invention.

Not shown in FIG. 6B is processing of the state Δ buffer 26a. This is because the frequency with which the current state array changes are copied to the buffer is a design choice. Nevertheless, the current state array changes must be copied at least twice, once preceding evaluation to capture holds and releases, and once after to capture the result of evaluation. Rollback in response to holds and releases according to the invention is illustrated in FIG. 6C. In this regard, in step 620, a determination is made that rollback is necessary to resolve conflict. Rollback time is also determined in step 620. Next, the loop including steps 621, 622, and 623 is traversed by inspecting the entries in the state Δ buffer and reverse time sequence, beginning with the current value of LVT and continuing until the time immediately preceding the rollback time. In this loop, each entry younger than the rollback time is deleted from the buffer. Eventually, when the simulation time is at the time step immediately preceding the rollback time, the positive exit is taken from decision 621, LVT is reset to the rollback time in step 624, the current state array 24a is set to the simulation time immediately preceding the rollback time in step 625. Forward simulation then resumes in step 626.

In the rollback processing of FIG. 6C, states are maintained using the base state array (the oldest entry in the state Δ buffer), the current state array 24a, and the state Δ buffer 26a. These data structures maintain hold flags as described previously in connection with FIG. 3C and, therefore, will restore a net or state to a value imposed by a hold message evaluated at a time preceding the rollback time. Since hold and release messages are maintained in the event queue 28a, a hold restored by a rollback is guaranteed to be released when forward simulation reaches the time slot in the event queue 28a where the release message is maintained.

Figure 6D:
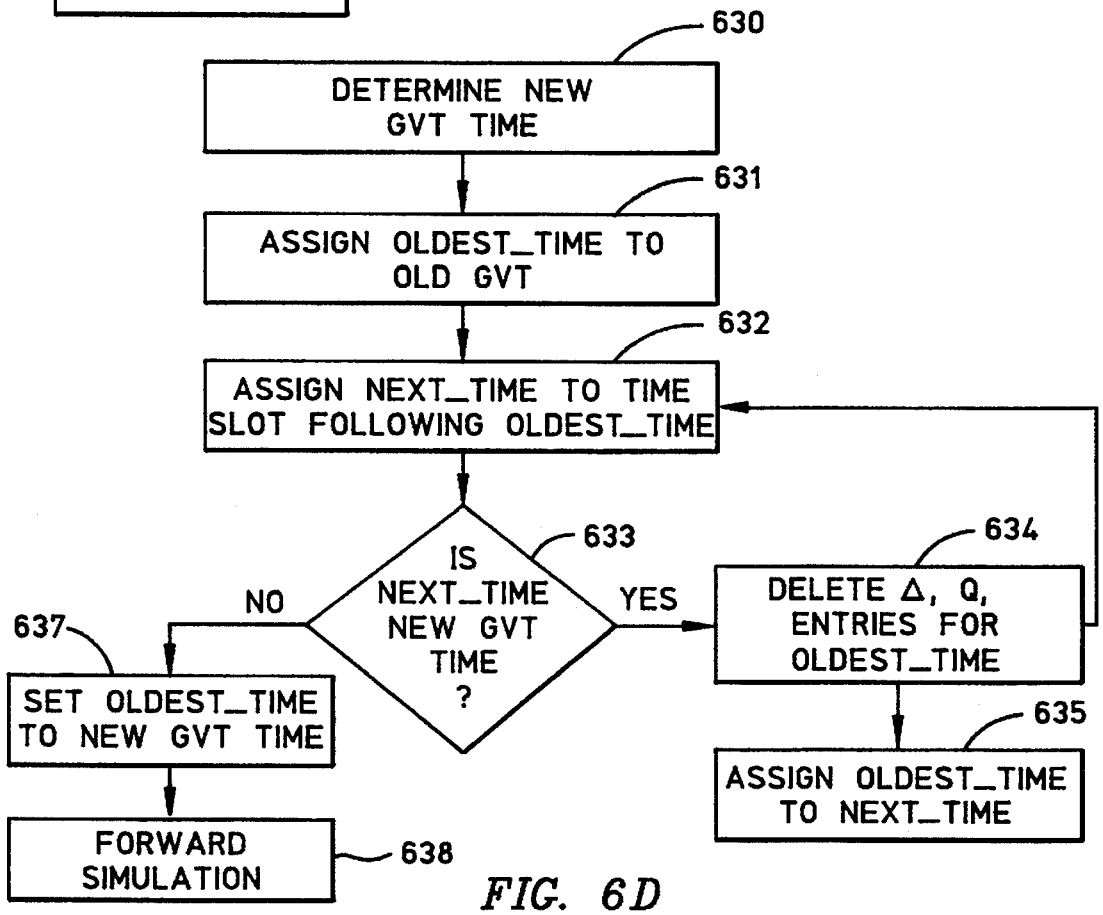

In FIG. 6D, a call to the GVT process results in calculation of a new GVT and initiates the processing for GVT advance when holds and releases are in the logic simulation system of FIG. 1. As inspection of FIG. 6D will reveal, the processing is identical to that illustrated in FIG. 5D. It is observed that a GVT advance beyond a hold message, followed by a rollback to a time preceding the corresponding release message will reinitiate the hold based upon the history following the hold as indicated by hold flags for the logic element maintained in the state Δ buffer 26a.

Those skilled in the art will appreciate that the logic components of FIGS. 5B and 6B may be merged into a single logic component that performs forward simulation in response to inputs from neighbors and user-input sets of nets and states. Similarly, the logic components of FIGS. 5C and 6C may be merged, as may be the logic components of FIGS. 5D and 6D.

BEST MODE

The description thus far given for processing user-initiated set and hold/release events is based upon the use of the state Δ buffer to provide a trace of event history in order to support rollback and GVT advance. In the best mode of the invention, the state Δ buffer 26 is eliminated, based upon the inventors' critical realization that the event queue 28 of any processing node may be adapted to provide an accurate trace of prior event history from GVT forward, with two provisions: the insertion of state information at the relevant time slots in the queue; and, for each simulated logic element, bi-directional linkage of event queue entries.

Figure 7:
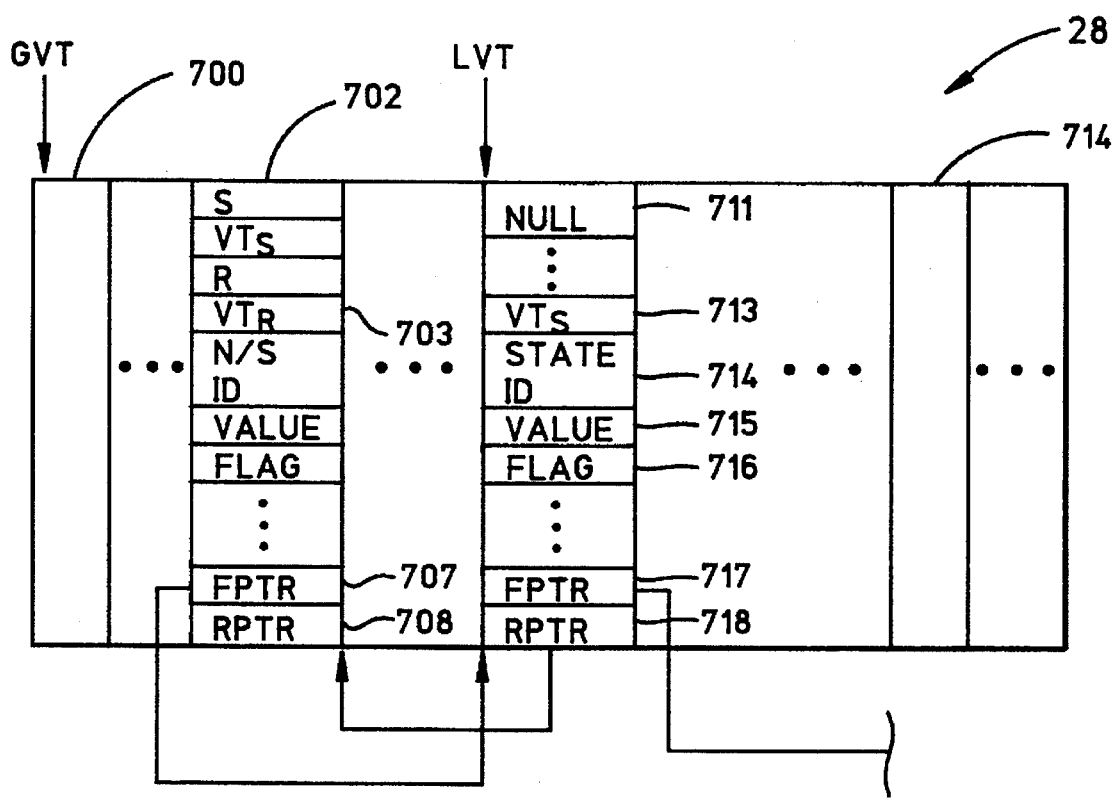
FIG. 7 shows an event queue in a simulation system executing computer network of FIG. 1 according to the best mode of carrying out the invention.

In this regard, with reference to FIG. 7, the event queue 28 includes a plurality of entries at respective simulation time slots extending from the time slot set to the last-calculated value for GVT, through a time slot corresponding to the local virtual time (LVT), as well as entries extending into the future, beyond LVT. The plurality of entries in the queue include an entry 700 at time slot GVT, an entry 702 at a time slot greater than GVT and less than LVT, an entry 712 at time slot LVT, and an entry 714 younger than LVT (in the future, not yet evaluated). The event queue 28 of FIG. 7 includes messages which are placed into the queue by the message handler 29. The event queue 28 also includes current state array entries for states that are entered into the event queue 28 by the logic simulation program 22a. The entries in the event queue 28a of FIG. 7 are sorted according to virtual time values which, in case of messages, includes the message receive time, and in the case of state entries, includes the local virtual time which the state entry is copied to the event queue 28.

Thus, the event queue entry 702 comprises a message having the format discussed earlier, including a field 703 for receive time. The event queue entry 712 represents an entry for a state obtained from the current state array 26. The format for the entry 712 corresponds substantially with that of messages in the queue with the following specific differences. In the field which would denote the sender S in a message, a null value is entered. This is indicated by the field 711 in the entry 712. In the field that is reserved, in messages, for receive time, the state entry includes a local virtual time value ($VT_s$) that denotes when the entry is placed in the event queue 28. This value is found in field 713 in the entry 712. The entry 712 also includes a field (714) to identify the state, a field (715) containing the value of the state at the time the entry was made, and a field (716) containing a flag which indicates whether the state value results from a set, a hold, a release, or inputs from neighbors.

All entries for a respective logic element that is being simulated by the processing node that owns the event queue 28 are connected by forward and reverse linkage. In this regard, assume that the message 702 and the entry 712 pertain to a respected state being simulated by a processing node. Assume that the message 702 is the first entry for the state in the event queue 28; no entries for the state are in the event queue between the message 702 and the state entry 712; and, the event queue 28 contains at least one other entry younger than state entry 712. The message 702 contains a field 707 for storing a forward pointer (FPTR) that points to the storage location of the state entry 712, and a field 708 for containing a reverse pointer (RPTR) that would point to any older events for the identified state in the event queue 28. Since the message 702 is the oldest member of the event queue 28 for the identified state, a null value is placed in the field 708. Similarly, the state entry 712 has a reverse pointer fields 718 that points to the storage location of the message 702, and a forward pointer field 717 that points to the storage location of the next-youngest event queue member for the identified state.

For any logic element in a processing node, there is only one set of linked event queue members that comprise a history trace for the element. The set may have none, one, or more than one members. For the purposes of this description, such a set is called a "wire".

Manifestly, the best mode of the invention eliminates the need for a state Δ buffer, since a trace of event history from GVT forward is contained in the event queue. Further, the logic described above to perform forward simulation, rollback, and GVT advance using a state Δ buffer may be easily adapted to use an event queue configured as illustrated in FIG. 7. In this regard, forward simulation through the event queue is as illustrated and described above with respect to FIGS. 5B and 6B, with the exception that state entries are saved periodically into their respective time slot locations in the event queue.

Rollback logic proceeds as illustrated and explained with reference to FIGS. 5C and 6C with the following exceptions. Rollback time is determined by a conflict involving an identified logic element (either a net or a state). The rollback time is determined in the manner described above. Once the rollback location is determined, the wire for the logic element involved in the conflict is followed forward in the event queue and all future events in the wire later than the rollback location are removed from the event queue. All other wires are traced backward in the event queue and, for each wire, the last event just prior to the rollback time is determined and that event is placed in the current state array. Thus, if rollback canceled an event which reset a previous set, the rollback will correctly restore the set. If a hold/release message pair exists for a wire representing a state, the hold/release events will be maintained in the event queue. In the case where a hold/release message pair is set for a state wire, assume that forward simulation progresses past both the hold and release. Assume further that a rollback occurs which returns the simulation to a time point between the hold and release. The above-described procedure for the best mode is robust since the last event just prior to the rollback time will be the hold event for the state and will be placed in the state array.

Last, the GVT advance logic illustrated in FIGS. 5D and 6D may be applied to the best mode of the application, using just the event queue, with no change in the result. Suppose, for example, that GVT advances beyond a hold in a hold/release message pair and then rollback occurs to a time point just before the release. The logic remains robust because at least one state entry for the state will have been entered into the event queue. In this regard, that state will be the last event just prior to the new rollback time. That single state entry will be a hold, all other entries for the state having been discarded in forward processing.

Clearly, other embodiments and modifications of the present invention will occur readily to those of ordinary skill in the art in view of these teachings. For example, any processing node comprising a conventional data processor, including a CPU, memory, I/O, program storage, a connecting bus, and other appropriate components, could be programmed or otherwise designed to facilitate a method which embodies the invention. Such a data processor would include appropriate program means for executing the method. Also, an article of manufacture, such as a pre-recorded disk or other similar data storage device, for use with a data processing system, could include a storage medium and program means recorded thereon for directing the data processing system to facilitate the practice of the method. It will be understood that such apparatus and articles of manufacture also fall within the spirit and scope of the invention. Therefore, this invention is to be limited only by the following claims, which include all such embodiments and modifications.

We claim:

1. A distributed virtual time logic simulator for simulating a circuit, said simulator comprising:

a plurality of processing nodes;

a plurality of logic simulation program means, for executing on respective ones of said processing nodes, to simulate respective elements of the circuit, each of said logic simulation program means for executing in response to events occurring at a local virtual time, including means for receiving an input from or supplying an output to another of said processing nodes;

user means for providing user inputs to said processing nodes;

a plurality of forward simulation means in respective ones of said processing nodes for setting and holding respective elements of the circuit in response to events denoting setting ("set events") and holding ("hold events") in respective user inputs; and a release means for receiving a user-initiated release which releases circuit elements that have been held in response to a holding event.

2. The distributed virtual time logic simulator of claim 1, further including:

a plurality of rollback means in respective ones of said processing nodes, for retaining set events and hold events at respective processing nodes in response to rollback at said respective processing nodes which reinitiates execution of a logic simulation program means at a local virtual time.

3. The distributed virtual time logic simulation system of claim 1, further including:

a plurality of global virtual time ("GVT") process means in respective ones of said processing nodes for calculating a new GVT of said virtual time logic simulator at respective ones of said processing nodes; and a plurality of GVT advance means in respective ones of said processing nodes, each GVT advance means for retaining set events and hold events which succeed a new GVT at a respective processing node.

4. The distributed virtual time logic simulation system of claim 2, further including:

a plurality of global virtual time ("GVT") process means in respective ones of said processing nodes for calculating a new GVT of said virtual time logic simulator at respective ones of said processing nodes; and a plurality of GVT advance means in respective ones of said processing nodes, each GVT advance means for retaining set events and hold events which succeed a new GVT at a respective processing node.

5. The distributed virtual time logic simulator of claim 1, further including at least one user interface, each coupled to one of the plurality of forward simulation means, for receiving user inputs designating the set events and hold events, and providing such events to the forward simulation means.

6. The distributed virtual time logic simulator of claim 5, wherein the user interface produces set messages in response to user inputs designating set events, each set message including a flag field containing a set flag identifying the message as a set event, the simulator further including a routing interface coupling the user interface with the processor nodes for routing set messages to processing nodes.

7. The distributed virtual time logic simulator of claim 5, wherein the user interface produces hold and release messages in response to user inputs designating hold events, each hold and release message including a flag field, the flag field of each hold message containing a hold flag identifying the message as a hold event, and the flag field of each release message including a release flag identifying the message as a release event, the distributed virtual time logic simulator further including a routing interface coupling the user interface with the processing nodes for routing hold and release messages to processing nodes.

8. The distributed virtual time logic simulator of claim 1, wherein:

each processing node of the plurality of processing nodes including an event queue for holding events in chronological order;

means in each processing node for placing state events in the event queue of the processing node;

each state event denoting a value for simulating a respective state element of the circuit.

* * * * *